United States Patent
Herman et al.

(10) Patent No.: US 7,140,725 B2
(45) Date of Patent: Nov. 28, 2006

(54) METHODS FOR APPLYING CRYSTALLINE MATERIALS

(75) Inventors: Gregory S Herman, Albany, OR (US);
Benjamin Clark, Corvallis, OR (US);
Peter Mardilovich, Corvallis, OR (US);
James O'Neil, Corvallis, OR (US);
David Champion, Lebanon, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 146 days.

(21) Appl. No.: 10/464,281

(22) Filed: Jun. 17, 2003

(65) Prior Publication Data
US 2004/0257422 A1    Dec. 23, 2004

(51) Int. Cl.
*B41J 2/01* (2006.01)
(52) U.S. Cl. .................. 347/101; 347/105
(58) Field of Classification Search ............. 347/105, 347/101, 107, 106, 100, 96, 95; 106/31.6, 106/31.27, 31.13; 523/160; 428/195, 32.1
See application file for complete search history.

(56) References Cited

U.S. PATENT DOCUMENTS 5,618,338 A * 4/1997 Kurabayashi et al. ....... 347/100
5,764,263 A * 6/1998 Lin ........................... 347/101

FOREIGN PATENT DOCUMENTS

| JP | 09-063954 | * 3/1997 |
| JP | 9063954 | 3/1997 |

OTHER PUBLICATIONS

Sangmoon Park, et al., "Low-Temperature Thin-Rim Deposition and Crystallization", SCIENCE, vol. 297, Jul. 5, 2002, pp. 65.
European Search Report dated Mar. 10, 2004.
Thomas P. Niesen and Mark R. DeGuire, Review: Deposition of Ceramic Thin Films at Low Temperatures from Aqueous Solutions; Journal of Electroceramics, V. 6, 2001, pp. 169-207.
James P. Shields, Thermal Inkjet Review, or How Do Dots Get from the Pen to the Page?, Hewlett-Packard Journal, Aguust 1992, pp. 67.
Sangmoon Park, et al, Low-Temperature Thin-Film Deposition and Crystallization, SCIENCE, V. 297, Jul. 5, 2002, pp. 65. www.sciencemag.org.

* cited by examiner

*Primary Examiner*—Manish S. Shah

(57) ABSTRACT

Disclosed herein are methods for applying crystalline materials to a substrate by applying a cation and an anion and crystallizing at least a portion of the reaction product of the cation and the anion. The application of at least one of the cation or the anion is actively controlled such that it is applied in a patternwise or blanketwise fashion.

45 Claims, 3 Drawing Sheets

METHODS FOR APPLYING CRYSTALLINE MATERIALS

BACKGROUND

1. Field of the Invention

The present invention generally relates to deposition and crystallization of materials onto a substrate.

2. Background Information

Crystallized materials have possible applications when applied to substrates. For many applications, the crystallized materials may need to be manufactured into layers or films on substrates. The quality of the crystallized material (i.e., level of crystallization, uniformity, thickness, continuity (number of defects) and other such properties) may affect the performance of the crystallized material and/or the substrate. In addition, some of these properties may be enhanced when the films are thin.

The technique or fabrication method used in preparing a crystallized compound layer or film may be selected based on a tradeoff of certain properties. For example, some fabrication methods may be suitable for producing very thin crystallized material films, but with low uniformity. Other processes may provide better uniformity, but may not be capable of achieving very thin films, and still other processes may require high temperatures to crystallize the film material, limiting the substrates which may be used.

Additionally, it may also be desirable for crystallized material to be distributed patternwise on a substrate. Applying crystalline material patternwise to a substrate may require aggressive methods of treatment. Those aggressive methods may include material deposition on the entire substrate followed by selective etching. This selective etching may adversely affect other components of the system. Other patterning methods may include the use of shadow masks or stencils, which may be slow and expensive. The subject matter described below may address one or more of these issues.

SUMMARY

Disclosed herein are methods for applying crystalline materials to a substrate by applying cationic solutions and anionic solutions and crystallizing at least a portion of the reaction product of the cations and the anions. The application of at least one of the cationic solutions or the anionic solutions is actively controlled such that it is applied in a patternwise or blanketwise fashion.

BRIEF DESCRIPTION OF THE DRAWINGS

For a detailed description of embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Embodiments of the invention may include a substrate material upon which both a cationic material and an anionic material have been applied and upon which the reaction product of the cationic and anionic materials has been crystallized. In particular embodiments, at least one of the cationic material or anionic material may be applied in a patternwise fashion by actively controlling the application. In other embodiments the blanket application of at least one of the cationic or anionic materials may occur in which the application is conducted by spraying the materials onto the substrate. As used herein, a blanket (or blanketwise) application occurs when materials are applied to an entire continuous area of the substrate. After the portion of the substrate to be blanketed is specifically chosen, the material may then be applied by actively controlled application to the entire chosen portion.

Figure 1:
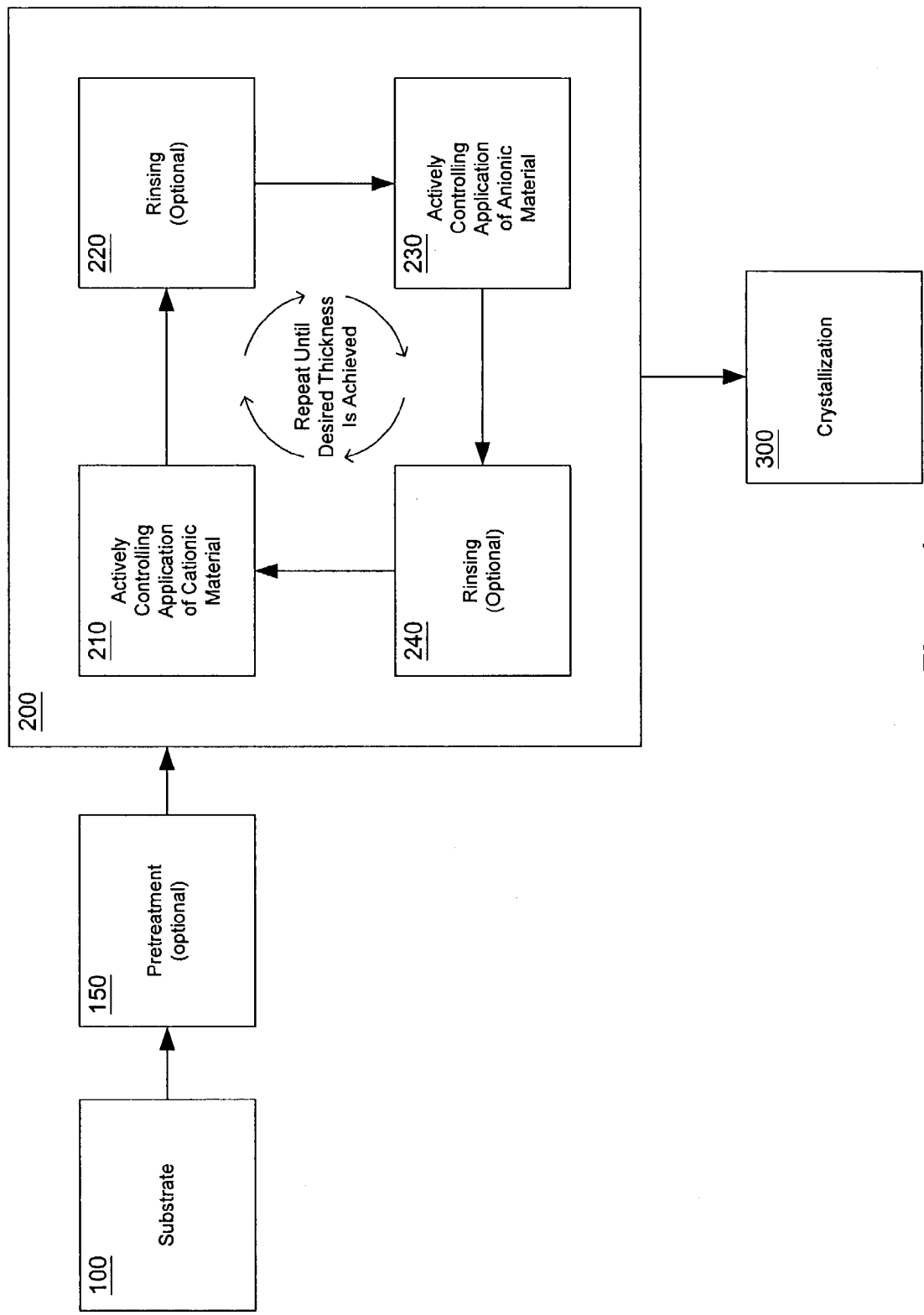
FIG. 1 shows a flow diagram of a process according to an embodiment of the present invention.

Referring now to FIG. 1, there are shown embodiments of the present invention comprising a substrate 100, a deposition process 200, and a crystallization process 300. Substrate 100 may comprise a wide variety of materials, such as, metals, oxides, salts, metal-organic, organic, polymers, polymer systems and the like. Substrate 100 may also comprise conductors, insulators, semiconductors, and the like. Substrate 100, which has optionally been pretreated in pretreatment step 150, is introduced to deposition process 200. Pretreatment step 150 may include, by way of example only, chemical modification by application of a chemical pretreatment, visible or UV irradiation, electron beam or ion beam irradiation, plasma treatment, or physical contact/imprinting.

In deposition process 200, cationic material 210 may be applied. The application of a cationic material 210 may be actively controlled in a patternwise fashion or a blanketwise fashion. The substrate 100 coated with the cation is optionally rinsed (e.g., by immersion or spraying with water or another suitable rinsing substance) in rinsing step 220 and then coated with an anionic material 230. The application of the anionic material may also be actively controlled in a patternwise fashion or a blanketwise fashion. The coated substrate may then be optionally rinsed in rinsing step 240. It is not necessary that the cation be applied prior to the anion. In some embodiments, the anion may be applied prior to the application of the cation. In yet other embodiments, the application of one of the cation or anion may occur at the same time, or have one begin prior to completion of the application of the other.

Upon or after application of the cationic and anionic materials, the anionic and cationic materials react resulting in a reaction product deposited on the substrate 100. If desired, this process may be repeated until the reaction product deposited on the substrate 100 reaches the desired thickness. Once the reaction product reaches the desired thickness, the reaction product on the substrate may then be crystallized at process 300. The crystallization process 300 may be performed in any suitable method. By way of example only, one method for crystallization includes hydrothermal dehydration.

It is not necessary that the cationic material and the anionic material be in their individual ionic form at the time of application. For example, the cationic material may be a metal in the form of a metal salt dissolved in solution. The anionic material may be, for example, sulfur bonded to another atom. The cationic material and/or the anionic material may not appear in their ionic form until they meet on the surface of the substrate.

The actively controlled patternwise or blanket application of anionic and/or cationic material to the substrate may be performed by many different printing methods (e.g., inkjet, contact, screen, offset, lamination printing, contact or non-contact chemical transfer, or electrostatic vapor phase transfer, etc.). For example, inkjet technology, such as that used in printers, may be adapted for the current application. An example of inkjet printing is discussed in J. P. Shields, *Thermal Inkjet Review*, Or *How Do Dots Get From The Pen To The Page*, HEWLETT-PACKARD JOURNAL 43 (4): 67—67 (August 1992), incorporated herein by reference. The patternwise application of the anionic material and/or the cationic material may be actively controlled by the movement of a nozzle or plurality of nozzles relative to the surface of the substrate. For example, a control algorithm may be used to control the nozzles and spray the cationic material and/or the anionic material in a desired pattern. Likewise, the blanket application may be performed by spraying on the anionic and/or cationic materials by, for example, an inkjet. Furthermore, inkjet methods allow precise control of the drop placement, volume, concentration, and spot size which may eliminate or reduce subsequent rinsing steps.

Figure 2:
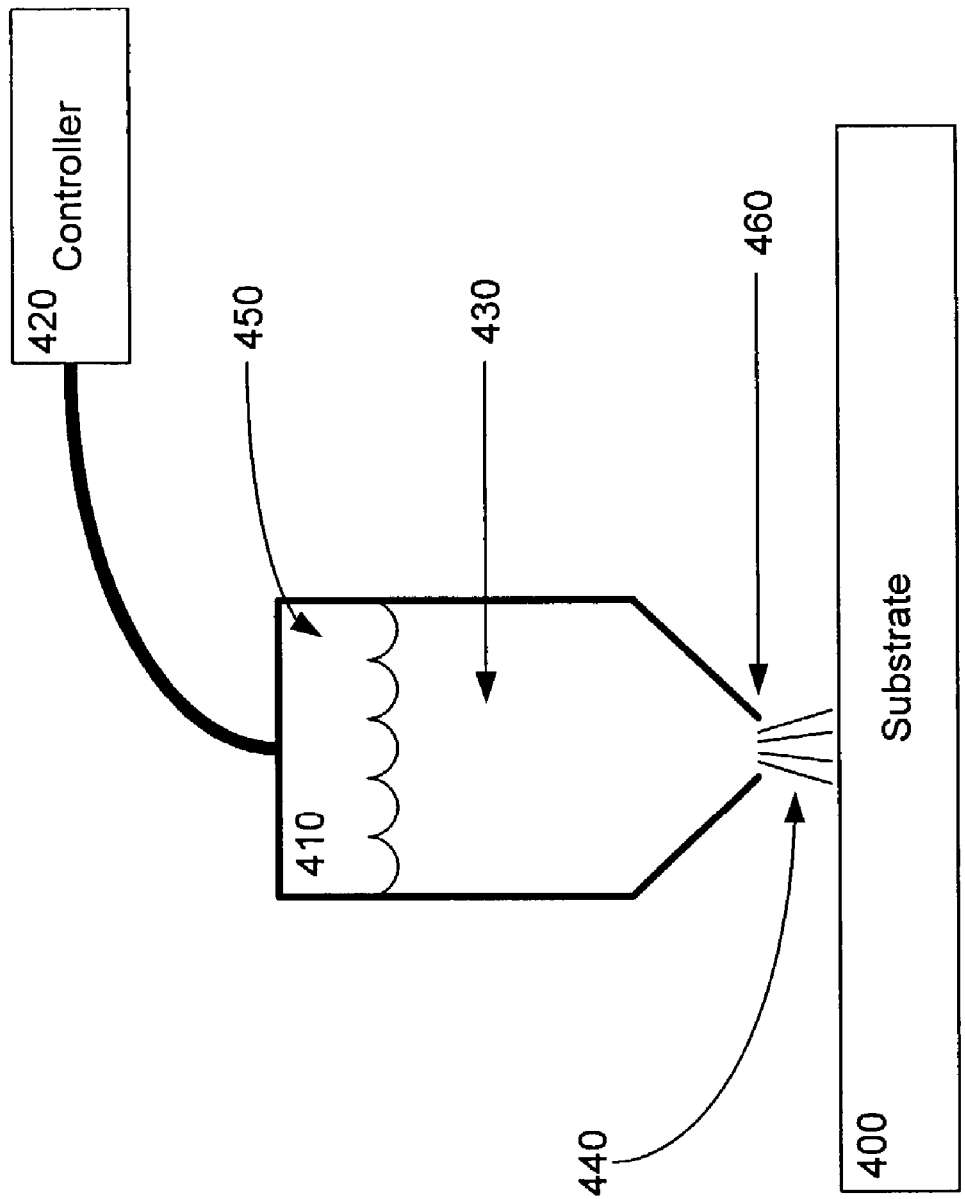
FIG. 2 shows a schematic drawing of an apparatus in accordance with embodiments of the present invention.

Referring now to FIG. 2, there is shown embodiments of the present invention comprising a print head 410, a nozzle 460, a reservoir 450, and a controller 420. In these embodiments, a material comprising a cation or anion 430 is printed onto substrate 400 by print head 410. The printing of the material and the relative movement of the print head 410 is actively controlled by controller 420. Controller 420 can be any suitable controlling mechanism, including, but not limited to, direct human control (e.g., a spraygun), indirect human control (e.g., remote controlled), or electronically controlled (e.g., computer).

Figure 3:
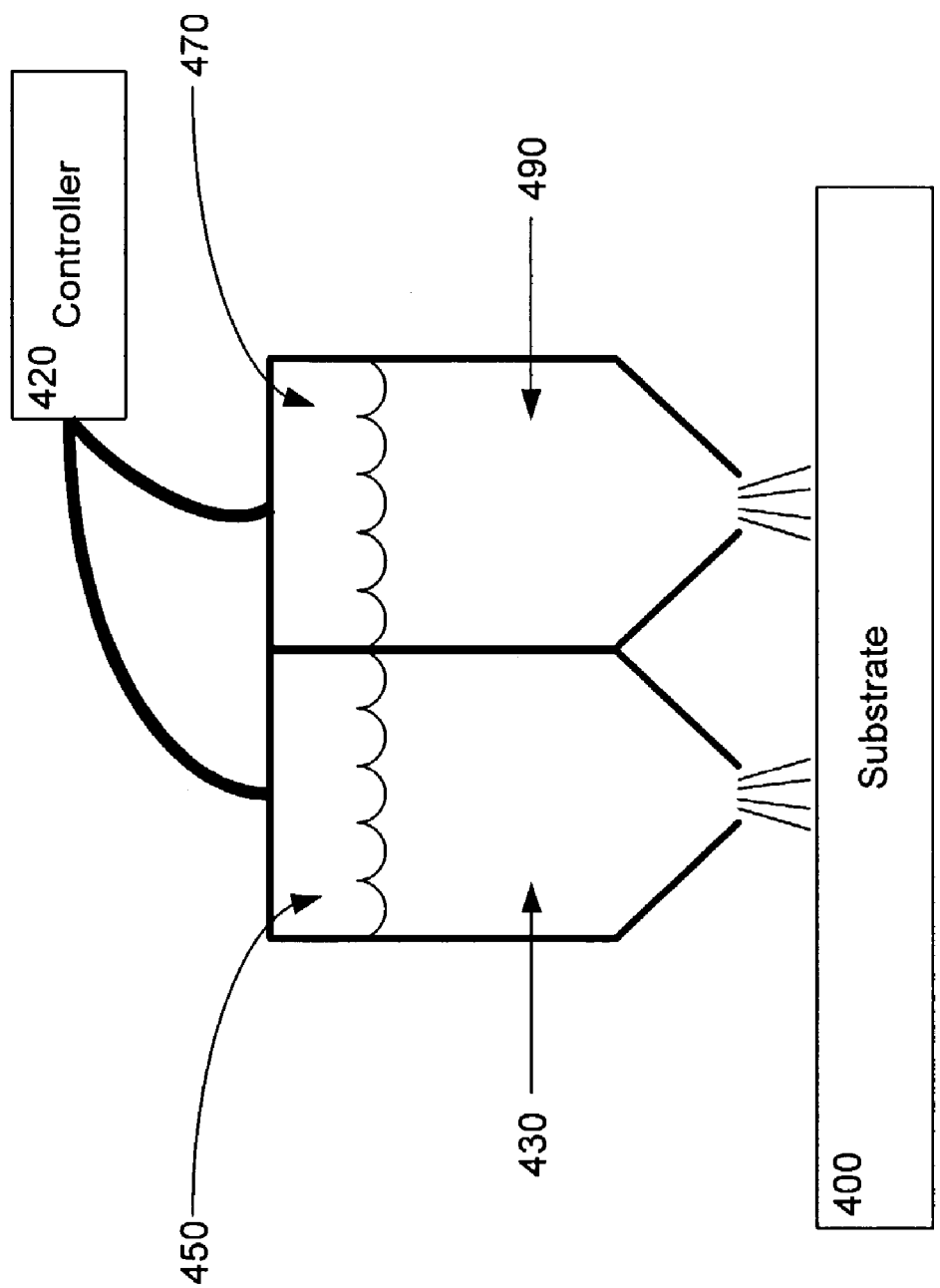
FIG. 3 shows a schematic drawing of a second apparatus in accordance with embodiments of the present invention.

In operation, material 430 exits print head 410 through nozzle 460 and is printed (e.g., by spraying 440) onto substrate 400. For example, the material comprising the cation may be printed onto substrate 400 by print head 410, followed by the printing of the material comprising the anion by a second print head (not shown). Alternatively, as is shown in FIG. 3, a single print head comprising two reservoirs 450 and 470 and two nozzles may be used to simultaneously or sequentially apply the material comprising the cation 430 and the material comprising the anion 490.

In some embodiments, $Zn_2SiO_4$, $ZrO_2$, and $MnO_2$ films may be deposited on substrates using a successive-ionic-layer-adsorption-and-reaction (SILAR) process. Generally, in a SILAR process, a cationic material is adsorbed onto a substrate surface and optionally rinsed to provide a monolayer of coverage. The anionic material is then applied. A precipitation reaction occurs on the surface of the substrate and a compound is deposited thereon. The coated substrate may then be rinsed. An exemplary description of a SILAR process performed by dipping, rather than printing, is disclosed in Park, Sangmoon, et al., *Low Temperature Thin-Film Deposition and Crystallization*, 297 SCIENCE 65 (Jul. 5, 2002). The SILAR process may be repeated as many times as necessary to achieve the desired deposition layer thickness on the substrate.

In some embodiments, films or patterns of $Zn_2SiO_4$ may be produced on glass and nitrided silicon ($Si_3N_4$/Si) substrates using the SILAR process combined with the active controlling of the application of 0.1M $Zn^{2+}$(aq) and 0.1M $SiO_4^{4-}$(aq) as the cationic and anionic constituents, respectively. The application may be actively controlled by, for example, inkjet printing technology. The film or pattern may be crystallized using hydrothermal dehydration by heating at 378K in a sealed 23 ml teflon lined Parr reactor containing 0.15 ml of water at about 12 atm. The hydrothermal dehydration may be carried out for about 12 hours, although more or less time may be necessary to complete the crystallization. The resulting film or pattern is a highly crystalline form of $Zn_2SiO_4$. Comparatively, annealing the coated substrate near its softening point of about 923K (without hydrothermal dehydration) will not produce a crystalline product.

In other embodiments, a film or pattern of $ZrO_2$ may be deposited on a nitrided silicon substrate by actively controlling the SILAR deposition of 0.1M aqueous $Zr^{4+}$ and 0.1M aqueous $OH^-$. The deposition may result in an amorphous, hydroxylated precipitate. The coated substrate may be hydro-thermally dehydrated at about 473K and the monoclinic form of $ZrO_2$ formed on the surface of the substrate. The hydrothermal dehydration may be carried out for about 12 hours, although more or less time may be necessary to complete the crystallization. Comparatively, direct annealing of the amorphous film in air (without hydrothermal dehydration) results in the production of an oxygen-deficient tetragonal form of $ZrO_{2-\delta}$. Annealing the monoclinic film at 923K resulted in no structural change.

In other embodiments, amorphous films or patterns of $MnO_2$ and $Mn_2O_3$ may be deposited on $SiO_2$/Si substrates by using the actively controlled SILAR deposition of 0.1M aqueous $Mn^{2+}$ and 0.1M aqueous $OH^-/H_2O_2$. The amorphous film may be hydrothermally dehydrated at about 473K and form tetragonal, rutile $MnO_2$. The hydrothermal dehydration may be carried out for about 12 hours, although more or less time may be necessary to complete the crystallization. If the amorphous film is annealed at 773K (without hydrothermal dehydration), oxygen may be lost and the cubic, bixbyite $Mn_2O_3$ formed.

Applicants have herein disclosed methods in which the application of the ionic solutions may be actively controlled. Particularly, the ionic solutions may be applied patternwise if desired, for example, by printing technology in which the nozzle is moved relative to the substrate and the ionic solutions are applied in a desired pattern. Other methods of patternwise application, other than the variation of SILAR described above, which may be suitable in embodiments of the present invention may include chemical bath deposition and/or liquid phase deposition. See, for example, T. P. Niesen and M. R. De Guire, *Review: Deposition of ceramic thin films at low temperatures from aqueous solutions*, 6 J. OF ELECTROCERAMICS 169–207 (2001). For example, a modification of the chemical bath deposition method can be realized where a solution in equilibrium between a complexing agent, water and a cationic metal-ligand can be printed first and a solution containing an anion formed by a hydrolyzed chalcogenide printed next, or vice versa. An example of liquid phase deposition would have a first aqueous solution with a metal-fluoro complex (comprising a flourinated metal cation) printed, the metal-fluoro complex may then be hydrolyzed by the printing of a second solution that contains water or boric acid. Anionic oxygen from the water or boric acid may form a metal oxide with the metal cation and be deposited on the substrate.

Additionally, if it is desirable to perform a blanket application on a portion of the substrate, the method of controlled application (e.g., printing) may be used to apply the blanket application. In some embodiments, it may also be desirable to apply one layer via blanket application and pattern another layer.

Applications in which it may be desirable to effect patternwise or blanketwise deposition of a crystalline material by controlled application may include without limitation, insulators, metals, semiconductors, and polymers. Other applications may include, by way of example only, the application of an electrode to an electrolyte or an electrolyte to an electrode in a fuel cell, batteries, flexible electronics including sensors, displays, and RFID tags.

Hydrothermal dehydration is a process in which a substrate may be heated in hydrothermal conditions (i.e., in the presence of water vapor and high pressure). During hydrothermal dehydration, the hydrated reaction product may be subject to wet heat at temperatures greater than the boiling temperature of water resulting in pressures greater than about 1 atm in a closed system. There is a fine balance where the reaction products are allowed to slightly dissolve and then recrystallize on the surface of the substrate. This balance can be controlled by temperature, water pH, or addition of other components/chemicals in the water. Hydrothermal dehydration may be advantageous in situations in which the substrate can not withstand the temperatures at which other crystallizations may be carried out by standard thermal annealing (e.g., plastic or polymeric substrates).

The reaction product is not necessarily a hydrated product. Other processes which may be used to crystallize the reaction product may include, without exclusion, annealing, localized laser processing, microwave, or hydrothermal treatments other than hydrothermal dehydration (e.g., hydrothermal hydration).

The above discussion is meant to be illustrative of the principles and various embodiments of the present invention. Numerous variations and modifications may become apparent to those skilled in the art once the above disclosure is fully appreciated. It is intended that the following claims be interpreted to embrace all such variations and modifications.

What is claimed is:

1. A method for the application of a compound to a substrate, the method comprising:
   (A) actively controlling the application of a material comprising a cation;
   (B) actively controlling the application of a material comprising an anion, wherein the cation and the anion react to form a compound; and
   (C) crystallizing at least a portion of the compound, wherein either the application of the cation or anion or both are applied onto only a portion of the substrate, and wherein the application of at least one of the material comprising a cation or the material comprising an anion is patternwise.

2. The method of claim 1 wherein the application of the material comprising a cation begins prior to the beginning of the application of the material comprising an anion.

3. The method of claim 1 wherein the application of the material comprising an anion begins prior to the beginning of the application of the material comprising a cation.

4. The method of claim 1 further comprising rinsing the substrate between step (A) and step (B).

5. The method of claim 1 wherein step (B) occurs prior to step (A) and further comprising rinsing the substrate between step (B) and step (A).

6. The method of claim 1 wherein step (C) comprises hydrothermal dehydration.

7. The method of claim 1 wherein steps (A) and (B) are repeated at least once prior to step (C).

8. The method of claim 1 wherein the applications in step (A) and step (B) are performed by printing.

9. The method of claim 1 wherein the application of at least one of the material comprising a cation or the material comprising an anion is blanketwise onto the portion of the substrate.

10. The method of claim 1 wherein the material comprising a cation comprises a cationic metal ligand and the material comprising an anion comprises a hydrolyzed chalcogenide.

11. The method of claim 1 wherein the material comprising a cation comprises a metal-fluoro complex and the material comprising an anion comprises water or boric acid.

12. The method of claim 1 wherein the steps (A) and (B) occur concurrently.

13. The method of claim 1, wherein either the application in step (A) or in step (B) or both are performed by printing.

14. A method for the application of a compound to a substrate, the method comprising:
   (A) spraying a material comprising a cation onto the substrate;
   (B) spraying a material comprising an anion onto the substrate, wherein the cation and the anion react to form a reaction product; and
   (C) crystallizing at least a portion of the reaction product, wherein the spraying of at least one of the material comprising the cation or the material comprising the anion is patternwise.

15. The method of claim 14 wherein the spraying of the material comprising the cation begins prior to the beginning of the spraying of the material comprising the anion.

16. The method of claim 14 wherein the spraying of the material comprising the anion begins prior to the beginning of the spraying of the material comprising the cation.

17. The method of claim 14 further comprising rinsing the substrate between step (A) and step (B).

18. The method of claim 14 wherein step (B) occurs prior to step (A) and further comprising rinsing the substrate between step (B) and step (A).

19. The method of claim 14 wherein step (C) comprises hydrothermal dehydration.

20. The method of claim 14 wherein steps (A) and (B) are repeated at least once prior to step (C).

21. The method of claim 14 wherein the applications in step (A) and step (B) are performed by printing.

22. The method of claim 14 wherein the spraying of at least one of the material comprising the cation or the material comprising the anion is blanketwise.

23. The method of claim 14 wherein the cation comprises a metal ligand and the anion is formed by the hydrolysis of a chalcogenide.

24. The method of claim 14 wherein the material comprising the cation comprises a metal-fluoro complex and the material comprising the anion comprises water or boric acid.

25. An apparatus for actively controlling the application of a compound to a substrate, the apparatus comprising:
   a first print head and a controller;
   wherein the controller controls the motion of the first print head relative to the substrate;
   wherein the first print head prints at least one of a material comprising a cation and a material comprising an anion onto the substrate;
   wherein the printed material reacts with another material to form a precipitate on the surface of the substrate; and a device for carrying out crystallization of at least a portion of the precipitate.

26. The apparatus of claim 25 further comprising a second print head wherein the first print head prints a material comprising a cation onto the substrate and the second print head prints a material comprising an anion onto the substrate and wherein the anion and the cation react to form the precipitate.

27. The apparatus of claim 26 wherein the first print head begins printing the material comprising a cation before the second print head begins printing the material comprising an anion.

28. The apparatus of claim 26 wherein the first print head begins printing the material comprising an anion before the second print head begins printing the material comprising a cation.

29. The apparatus of claim 25 wherein the first print head comprises at least two nozzles, wherein a material comprising a cation is printed through the first nozzle and a material comprising an anion is printed through the second nozzle.

30. The apparatus of claim 25 wherein the material comprising a cation comprises a cationic metal ligand and the material comprising an anion comprises a hydrolyzed chalcogenide.

31. The apparatus of claim 25 wherein the material comprising a cation comprises a metal-fluoro complex and the material comprising an anion comprises water or boric acid.

32. The method of claim 25 wherein the first print head prints essentially concurrently the material comprising the cation and the material comprising the anion onto the substrate.

33. A method for the application of a compound to a substrate, the method comprising:
(A) applying a material comprising a cation;
(B) applying a material comprising an anion; wherein the application of at least one of the material comprising the cation and the material comprising the anion is actively controlled, and wherein the cation and the anion react to form a precipitate; and
(C) crystallizing at least a portion of the precipitate, wherein either the application of the cation or anion or both are applied onto only a portion of the substrate, and wherein the application of at least one of the material comprising the cation or the material comprising the anion is patternwise.

34. The method of claim 33 wherein the application of the material comprising the cation begins prior to the beginning of the application of the material comprising the anion.

35. The method of claim 33 wherein the application of the material comprising the anion begins prior to the beginning of the application of the material comprising the cation.

36. The method of claim 33 further comprising rinsing the substrate between step (A) and step (B).

37. The method of claim 33 wherein step (B) occurs prior to step (A) and further comprising rinsing the substrate between step (B) and step (A).

38. The method of claim 33 wherein step (C) comprises hydrothermal dehydration.

39. The method of claim 33 wherein steps (A) and (B) are repeated at least once prior to step (C).

40. The method of claim 33 wherein the applications in step (A) and step (B) are performed by printing.

41. The method of claim 33 wherein the application of at least one of the material comprising the cation or the material comprising the anion is blanketwise onto the portion of the substrate.

42. The method of claim 33 wherein the cation comprises a metal ligand and the anion is formed by the hydrolysis of a chalcogenide.

43. The method of claim 33 wherein the material comprising the cation comprises a metal-fluoro complex and the material comprising the anion comprises water or boric acid.

44. The method of claim 33, wherein either the application in step (A) or in step (B) or both are performed by printing.

45. The method of claim 33 wherein the steps (A) and (B) occur concurrently.

* * * * *